(12) United States Patent
Brox et al.

(10) Patent No.: US 11,948,622 B2
(45) Date of Patent: Apr. 2, 2024

(54) GENERATING ACCESS LINE VOLTAGES

(71) Applicant: Micron Technology, Inc., Boise, ID (US)

(72) Inventors: Martin Brox, Munich (DE); C. Omar Benitez, Meridian, ID (US); Johnathan L. Gossi, Boise, ID (US); Christopher John Kawamura, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 168 days.

(21) Appl. No.: 17/659,405

(22) Filed: Apr. 15, 2022

(65) Prior Publication Data

US 2023/0335179 A1   Oct. 19, 2023

(51) Int. Cl.
| | |
|---|---|
| *G11C 11/40* | (2006.01) |
| *G11C 5/14* | (2006.01) |
| *G11C 11/22* | (2006.01) |
| *G11C 11/408* | (2006.01) |
| *G11C 11/4094* | (2006.01) |

(52) U.S. Cl.
CPC ......... *G11C 11/4085* (2013.01); *G11C 5/14* (2013.01); *G11C 11/2259* (2013.01); *G11C 11/4094* (2013.01); *G11C 11/221* (2013.01)

(58) Field of Classification Search
None
See application file for complete search history.

(56) References Cited

U.S. PATENT DOCUMENTS

| | | | |
|---|---|---|---|
| 8,630,139 B2 * | 1/2014 | Braceras | G11C 11/413 365/207 |
| 9,263,096 B1 * | 2/2016 | Binyamini | G11C 29/50 |
| 2012/0033506 A1 * | 2/2012 | Furutani | G11C 5/147 365/189.09 |
| 2016/0027495 A1 * | 1/2016 | Kim | G11C 11/4091 365/189.011 |

* cited by examiner

*Primary Examiner* — Tan T. Nguyen
(74) *Attorney, Agent, or Firm* — Holland & Hart LLP

(57) ABSTRACT

Methods, systems, and devices for techniques for generating access line voltages are described. A system may use a first voltage supply and a second voltage supply that is configured to supply a lower voltage than the first voltage supply. The system may activate a first circuit to couple a node with the first voltage supply so that a first voltage develops on the node from the first voltage supply. The system may activate a second circuit to couple the node with the second voltage supply so that a second voltage that is lower than the first voltage develops on the node from the second voltage supply.

30 Claims, 7 Drawing Sheets

GENERATING ACCESS LINE VOLTAGES

FIELD OF TECHNOLOGY

The following relates to one or more systems for memory, including techniques for generating access line voltages.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not- or (NOR) and not- and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

A memory system may include one or more memory arrays that store information and peripheral circuitry that supports the operation of the memory system. Before being deployed in the field, a memory system may undergo testing, which may include a stress test, referred to as burn-in, in which various components of the memory system are applied with voltages that are higher than the operating voltages used in another mode such as a non-burn-in mode. For example, during burn-in the digit lines of the memory system may be applied with a stress voltage ($V_{STRESS}$) that is higher than an operating voltage ($V_{Ary}$) used to operate the digit lines in the non-burn-in mode. To generate the stress voltage, the memory system may increase the voltage supplied by a first voltage supply (e.g., $V_{DD}$). But increasing the first voltage supply for burn-in may increase current leakage and degrade other circuitry (e.g., peripheral circuitry) that is coupled with the first voltage supply, among other drawbacks.

According to the techniques described herein, a memory system may generate the stress voltage for burn-in (or for other modes that use relatively higher voltage for the digit lines) by using a second voltage supply (e.g., $V_{PP}$) that is higher than a first voltage supply used to energize the peripheral circuitry. The second voltage supply may be the voltage supply used to generate the voltage for the word lines in the memory array—and thus may be a sufficiently high level to generate $V_{STRESS}$ for the digit lines—but may be isolated from the peripheral circuitry—which may allow burn-in to occur without degrading the peripheral circuitry, among other advantages.

Features of the disclosure are initially described in the context of systems and dies as described with reference to FIGS. 1 and 2. Features of the disclosure are described in the context of a system and a process flow as described with reference to FIGS. 3 and 4. These and other features of the disclosure are further illustrated by and described with reference to an apparatus diagram and flowcharts that relate to techniques for generating access line voltages as described with reference to FIGS. 5-7.

Figure 1:
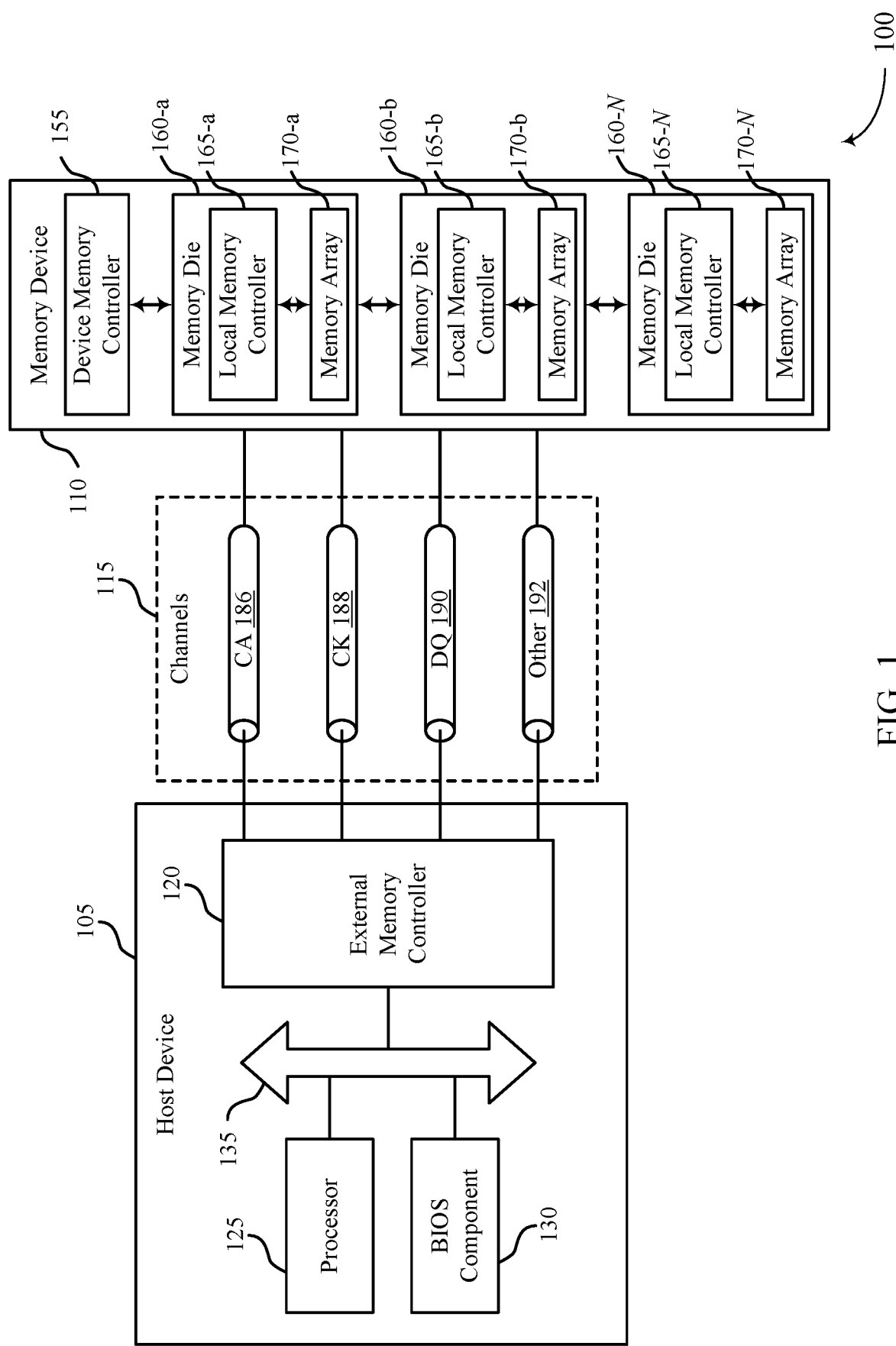
FIG. 1 illustrates an example of a system that supports techniques for generating access line voltages in accordance with examples as disclosed herein.

FIG. 1 illustrates an example of a system 100 that supports techniques for generating access line voltages in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

In some examples, the system 100 or the host device 105 may include an input component, an output component, or both. An input component may represent a device or signal external to the system 100 that provides information (e.g., signals, data) to the system 100 or its components. In some examples, and input component may include an interface (e.g., a user interface or an interface between other devices). In some examples, an input component may be a peripheral that interfaces with system 100 via one or more peripheral components or may be managed by an I/O controller. An output component may represent a device or signal external to the system 100 operable to receive an output from the system 100 or any of its components. Examples of an output component may include a display, audio speakers, a printing device, another processor on a printed circuit board, and others. In some examples, an output may be a peripheral that interfaces with the system 100 via one or more peripheral components or may be managed by an I/O controller.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-*a*, memory die 160-*b*, memory die 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100

(e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

The memory device 110 may be coupled with a first voltage supply (e.g., $V_{DD}$) and a second voltage supply (e.g., $V_{PP}$) that is higher than the first voltage supply. The first voltage supply may be coupled with (and configured to provide voltage to) peripheral circuitry and the second voltage supply may be coupled with (and configured to provide voltage for) word lines in the memory die(s) 165. According to the techniques described herein, the memory device 110 may use the first voltage supply to generate voltage for the digit lines in a non-burn-in mode (or other mode that uses low voltage) and may use the second voltage supply to generate voltage for the digit lines in a burn-in mode. By using the second voltage supply to generate voltage for the burn-in mode (as opposed to using the first voltage supply), the memory device 110 may avoid applying high voltage to the circuitry (e.g., the peripheral circuitry) of the memory device 110 that is coupled with the first voltage supply. Thus, the memory device 110 may decrease leakage current and degradation of the peripheral circuitry during burn-in mode compared to other techniques.

Figure 2:
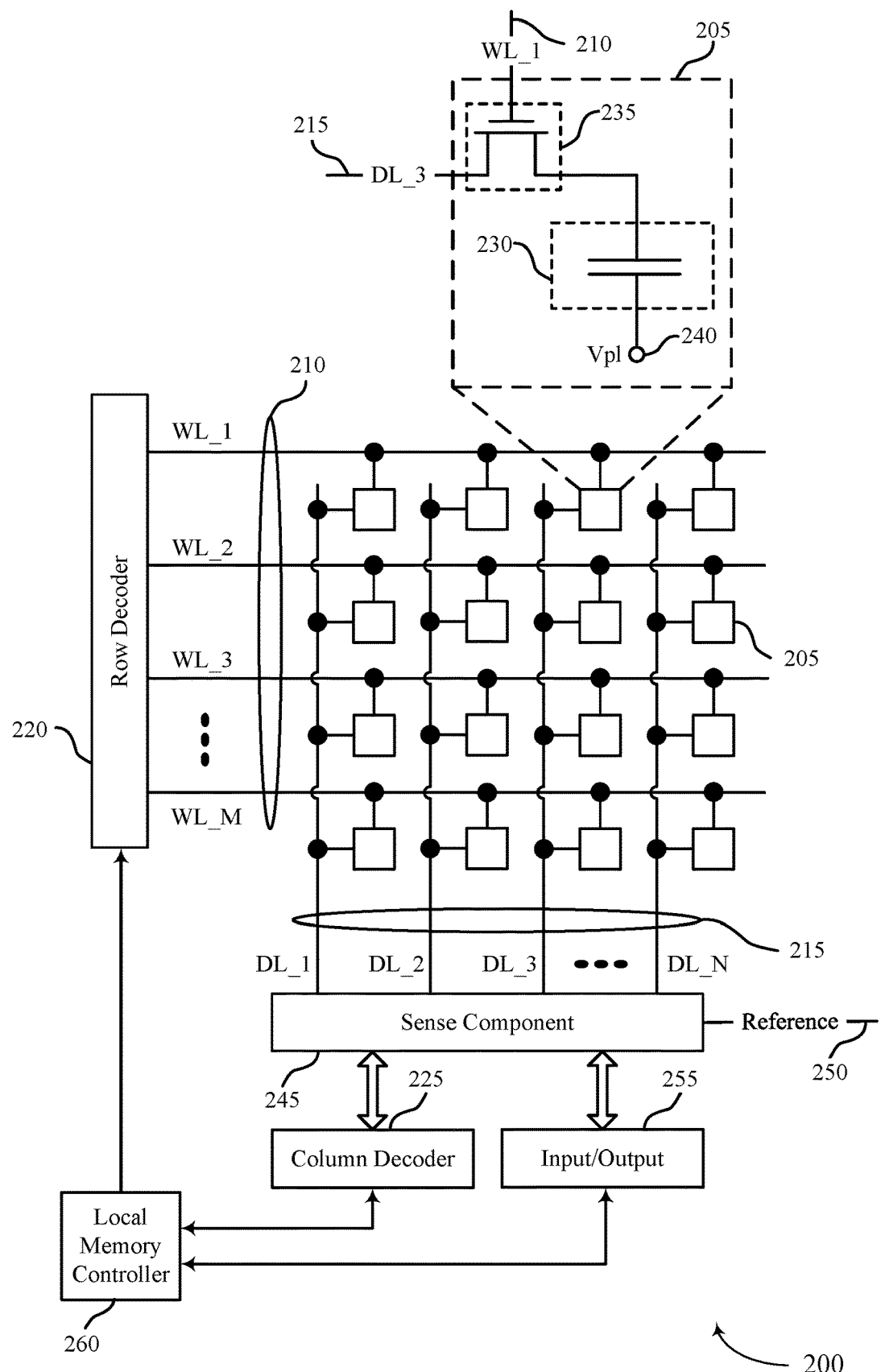
FIG. 2 illustrates an example of a memory die that supports techniques for generating access line voltages in accordance with examples as disclosed herein.

FIG. 2 illustrates an example of a memory die 200 that supports techniques for generating access line voltages in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235 (e.g., a cell selection component). The capacitor 230 may be an example of a dielectric capacitor or a ferroelectric capacitor. A node of the capacitor 230 may be coupled with a voltage source 240, which may be the cell plate reference voltage, such as Vpl, or may be ground, such as $V_{SS}$.

The memory die 200 may include access lines (e.g., word lines 210 and digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding. Memory cells 205 may be positioned at intersections of the word lines 210 and the digit lines 215.

Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a column decoder 225, or a combination thereof. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be decoupled from digit line 215 when the switching component 235 is deactivated, and the capacitor 230 may be coupled with digit line 215 when the switching component 235 is activated. Decoupling components may also be referred to as isolating the components and may include removing or cutting off a conductive path between the components.

A word line 210 may be a conductive line in electronic communication with a memory cell 205 that is used to perform access operations on the memory cell 205. In some architectures, the word line 210 may be coupled with a gate of a switching component 235 of a memory cell 205 and may be operable to control the switching component 235 of the memory cell. In some architectures, the word line 210 may be coupled with a node of the capacitor of the memory cell 205 and the memory cell 205 may not include a switching component.

A digit line 215 may be a conductive line that couples the memory cell 205 with a sense component 245. In some architectures, the memory cell 205 may be selectively coupled with the digit line 215 during portions of an access operation. For example, the word line 210 and the switching component 235 of the memory cell 205 may be operable to couple or decouple the capacitor 230 of the memory cell 205 and the digit line 215. In some architectures, the memory cell 205 may be coupled with the digit line 215.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device (e.g., a memory device 110) that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 260 may generate row signals and column address signals to activate the target word line 210 and the target digit line 215. The local memory controller 260 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

In some examples, the digit lines 215 may be coupled with a first voltage supply (e.g., $V_{DD}$) and the word lines 210 may be coupled with a second voltage supply (e.g., $V_{PP}$) that supplies a voltage higher than the first voltage supply. The first voltage supply may also be coupled with circuitry (e.g., peripheral circuitry) that supports the operation of the memory die 200. To prevent degradation of the peripheral circuitry during burn-in mode, and other disadvantages, the memory die 200 may use the second voltage supply to generate $V_{STRESS}$ during burn-in and may use the first external voltage supply to generate $V_{Ary}$ during non-burn-in operation.

Figure 3:
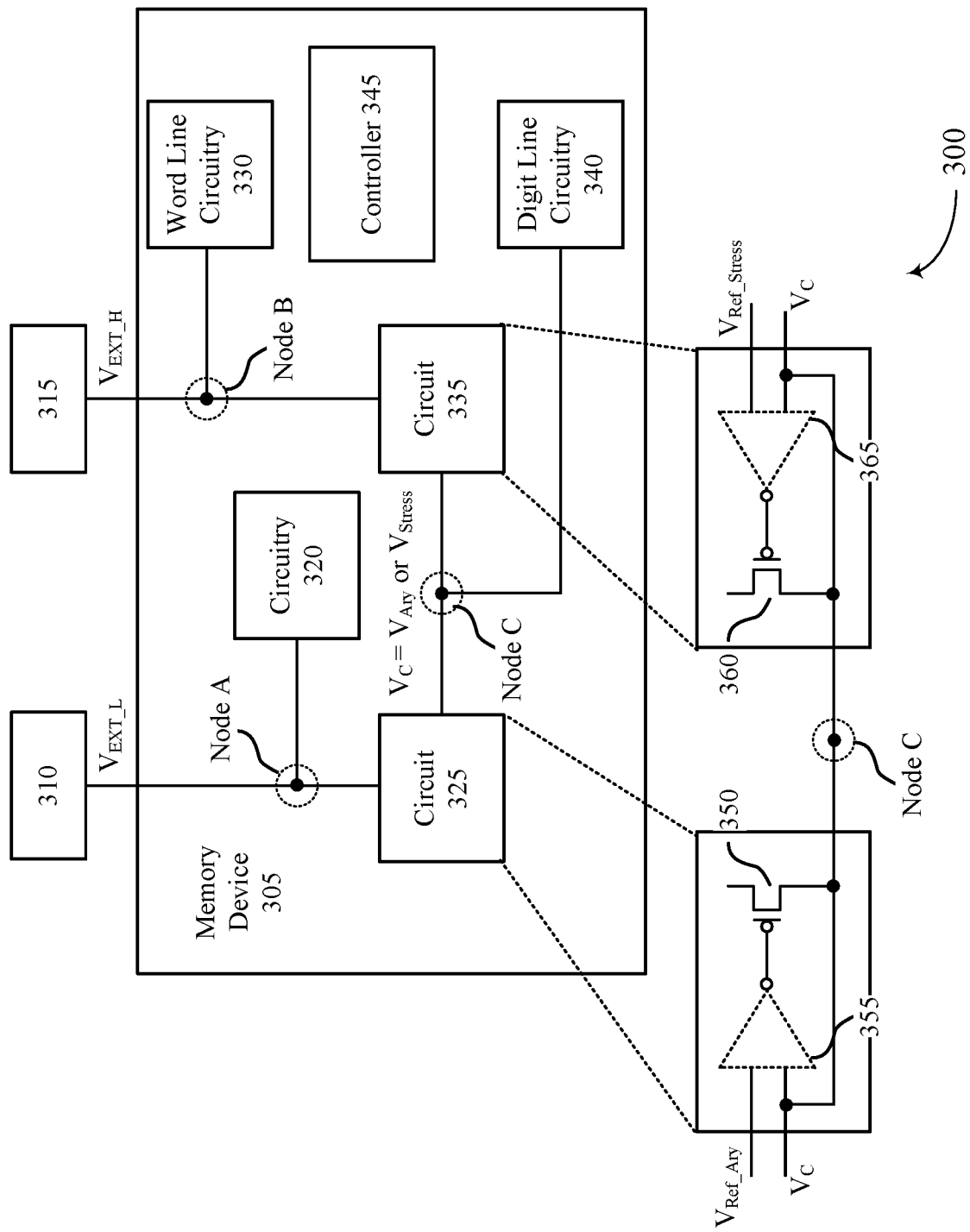
FIG. 3 illustrates an example of a system that supports techniques for generating access line voltages in accordance with examples as disclosed herein.

FIG. 3 illustrates an example of a system 300 that supports techniques for generating access line voltages in accordance with examples as disclosed herein. The system 300 may include a memory device 305 that may be an example of a memory device 110 as described with reference to FIG. 1. The memory device 305 may be coupled with a voltage supply 310 and a voltage supply 315. The voltage supply 310 and the voltage supply 315 may be external voltage supplies that are generated by components outside the package that contains the memory device 305. Relative to other techniques, the memory device 305 may reduce current leakage and component degradation by using the voltage supply 315 to generate a stress voltage ($V_{Stress}$) that is applied to digit lines in a memory array of the memory device 305 during burn-in. A voltage supply may also be referred to as a voltage source or other suitable terminology.

The voltage supply 310 may be configured to supply a voltage $V_{EXT\_L}$ and the voltage supply 315 may be configured to supply a voltage $V_{EXT\_H}$ that is higher than $V_{EXT\_L}$. The voltage supply 310 may supply the voltage $V_{EXT\_L}$ to the circuitry 320 via node A, which may be coupled with circuit 325. The voltage supply 315 may supply the voltage $V_{EXT\_L}$ to the word line circuitry 330 via node B, which may be coupled with circuit 335. The word line circuitry 330, which may include one or more charge pumps, may be configured to apply a voltage that is based on $V_{EXT\_H}$ to word lines in the memory array. In some examples, the voltage supply 310 is $V_{DD}$ and the second voltage supply is $V_{PP}$. However, other voltage supplies are contemplated and within the scope of the present disclosure.

The circuitry 320 may be circuitry (e.g., peripheral circuitry) that is configured to support the operation of the system 300. Peripheral circuitry may refer to transistors or other components that are, in some examples, outside (e.g., external to) the memory array(s) and that facilitate operation of the system 300, including, potentially, the memory array(s). Additionally or alternatively, peripheral circuitry may refer to input devices or output devices, or an interface for such devices, that may be integrated into or with the system 300. Examples may include one or more of: a disk controller, a sound controller, a graphics controller, an Ethernet controller, a modem, a universal serial bus (USB) controller, a serial or parallel port, or a peripheral card slot such as peripheral component interconnect (PCI) or specialized graphics ports. The peripheral circuitry may be other components understood by a person having ordinary skill in the art as peripheral components.

The circuit 325 may be configured to couple (e.g., establish a conductive path between) the voltage supply 310 and node C so that a voltage (e.g., $V_{Ary}$) based on $V_{EXT\_L}$ develops on node C. Similarly, the circuit 335 may be configured to couple the voltage supply 310 with node C so that a voltage (e.g., $V_{STRESS}$) based on $V_{EXT\_H}$ develops on node C. Because the voltage (e.g., $V_{EXT\_H}$) supplied by the voltage supply 315 is higher than the voltage (e.g., $V_{EXT\_L}$) supplied by the voltage supply 310, the voltage $V_{STRESS}$ on node C (which is based on $V_{EXT\_H}$) may be higher than the voltage $V_{Ary}$ on node C (which is based on $V_{EXT\_L}$).

Node C may be coupled with digit line circuitry 340, which may be configured to apply the voltage $V_C$ on node C to digit lines in the memory array. Thus, the digit line circuitry 340 may be coupled with digit lines in the memory array. As noted, the voltage $V_C$ on node C may be different in different modes. For instance, the voltage $V_C$ on node C may be equal to $V_{STRESS}$ during burn-in (e.g., because circuit 335 is activated and circuit 325 is deactivated) and may be equal to $V_{Ary}$ in a non-burn-in mode (e.g., because circuit 325 is activated and circuit 335 is deactivated).

The controller 345 may be coupled with the circuit 325 and the circuit 335 and may control (e.g., activate, deactivate) the circuit 325 and the circuit 335. For example, the controller 345 may control the circuit 325 so that the voltage supply 310 is used to develop $V_{Ary}$ on node C during non-burn-in operation and may control the circuit 335 so that the voltage supply 315 is used to develop $V_{STRESS}$ on node C during burn-in. By using the voltage supply 315 to develop $V_{STRESS}$ (instead of using the voltage supply 310, which would need to be increased), the system 300 may avoid developing a high voltage on node A during burn-in, and thus may prevent current leakage and degradation of the circuitry 320 during burn-in.

In some examples, the circuit 325 may include a switching component 350 (e.g., a transistor, a diode) that is configured to 1) transfer current from the voltage supply 310 to node C if activated and, 2) prevent the transfer of current from the voltage supply 310 to node C if deactivated. If the switching component 350 is a transistor, the switching component may be P-type transistor (as shown) or an N-type transistor. The switching component 350 may be operated so that the voltage developed on node C matches (e.g., is equal to) the voltage $V_{EXT\_L}$ from the voltage supply 310. Alternatively, the switching component 350 may be operated so that the voltage developed on node C is lower than the voltage $V_{EXT\_L}$ from the voltage supply 310 (e.g., the switching component 350 may provide a variable resistance that allows the voltage $V_{EXT\_L}$ to be down-converted).

In some examples, the circuit 325 may include an amplifier 355 that is configured to control the switching component 350. For example, the amplifier 355 may be configured to activate and deactivate the switching component 350 based on a reference voltage $V_{Ref\_Ary}$, which may be equal to $V_{Ary}$. The amplifier 355 may compare the reference voltage $V_{Ref\_Ary}$ with the voltage $V_C$ on node C and output a signal (e.g., to switching component 350) based on the difference. For instance, if the reference voltage $V_{Ref\_Ary}$ is higher than the voltage $V_C$ on node C the amplifier 355 may output an activation voltage that activates the switching component 350. So, an output node of the circuit 325 may be coupled with an input node of the circuit 325. Put another way, an output node of the switching component 350 may be coupled with an input node of the amplifier 355. Thus, the switching component 350 and the amplifier 355 may, together, form a regulation feedback loop. Alternatively, the amplifier 355 may be omitted and the switching component 350 may be controlled by the controller 345.

The amplifier 355 may be activated by applying a first voltage (e.g., reference voltage $V_{Ref\_Ary}$) to an input node of the amplifier 355 and may be deactivated by applying a second voltage (e.g., a lower voltage than the first voltage, $V_{SS}$) to the input node. Application of voltage to the input node of the amplifier 355 may be controlled by the controller 345 (e.g., based on the mode of the system 300). For instance, the reference voltage $V_{Ref\_Ary}$ may be applied to the amplifier 355 in a non-burn-in mode (so that node C can charge from the voltage supply 310) and the second voltage (e.g., $V_{SS}$) may be applied to the amplifier 355 in burn-in mode (so that node C can charge from the voltage supply 315).

In some examples, the circuit 335 may include a switching component 360 (e.g., a transistor, a diode) that is configured to 1) transfer current from the voltage supply 315 to node C if activated and, 2) prevent the transfer of current from the voltage supply 315 to node C if deactivated. If the switching component 360 is a transistor, the switching component may be P-type transistor (as shown) or an N-type transistor. The switching component 360 may be operated so that the voltage developed on node C matches (e.g., is equal to) the voltage $V_{EXT\_H}$ from the voltage supply 315 Alternatively, the switching component 360 may be operated so that the voltage developed on node C is lower than the voltage $V_{EXT\_H}$ from the voltage supply 315 (e.g., the switching component 360 may provide a variable resistance that allows the voltage $V_{EXT\_H}$ to be down-converted).

In some examples, the circuit 335 may include an amplifier 365 that is configured to control switching component 360. For example, the amplifier 365 may be configured to activate and deactivate the switching component 360 based on a reference voltage $V_{Ref\_Stress}$, which may be equal to $V_{Stress}$. The amplifier 365 may compare the reference voltage $V_{Ref\_Stress}$ with the voltage $V_C$ on node C and output a signal (e.g., to switching component 360) based on the difference. For instance, if the reference voltage $V_{Ref\_Stress}$ is higher than the voltage $V_C$ on node C the amplifier 355 may output an activation voltage that activates the switching component 360. So, an output node of the circuit 335 may be coupled with an input node of the circuit 335. Put another way, an output node of the switching component 360 may be coupled with an input node of the amplifier 365. Thus, together, the switching component 360 and the amplifier 365 may form a regulation feedback loop. Alternatively, the amplifier 365 may be omitted and the switching component 360 may be controlled by the controller 345.

The amplifier 365 may be activated by applying a first voltage (e.g., reference voltage $V_{Ref\_Stress}$) to an input node of the amplifier 365 and may be deactivated by applying a second voltage (e.g., a lower voltage than the first voltage, $V_{SS}$) to the input node. Application of voltage to the input node of the amplifier 365 may be controlled by the controller 345 (e.g., based on the mode of the system 300). For instance, the reference voltage $V_{Ref\_Stress}$ may be applied to the amplifier 365 in burn-in mode (so that node C can charge from the voltage supply 315) and the second voltage (e.g., $V_{SS}$) may be applied to the amplifier 365 in a non-burn-in mode (so that node C can charge from the voltage supply 310).

Thus, the system 300 may switch between the voltage supply 310 and the voltage supply 315 to generate different digit line voltages during burn-in and non-burn-in modes, which may improve the performance and longevity of the system 300.

Figure 4:
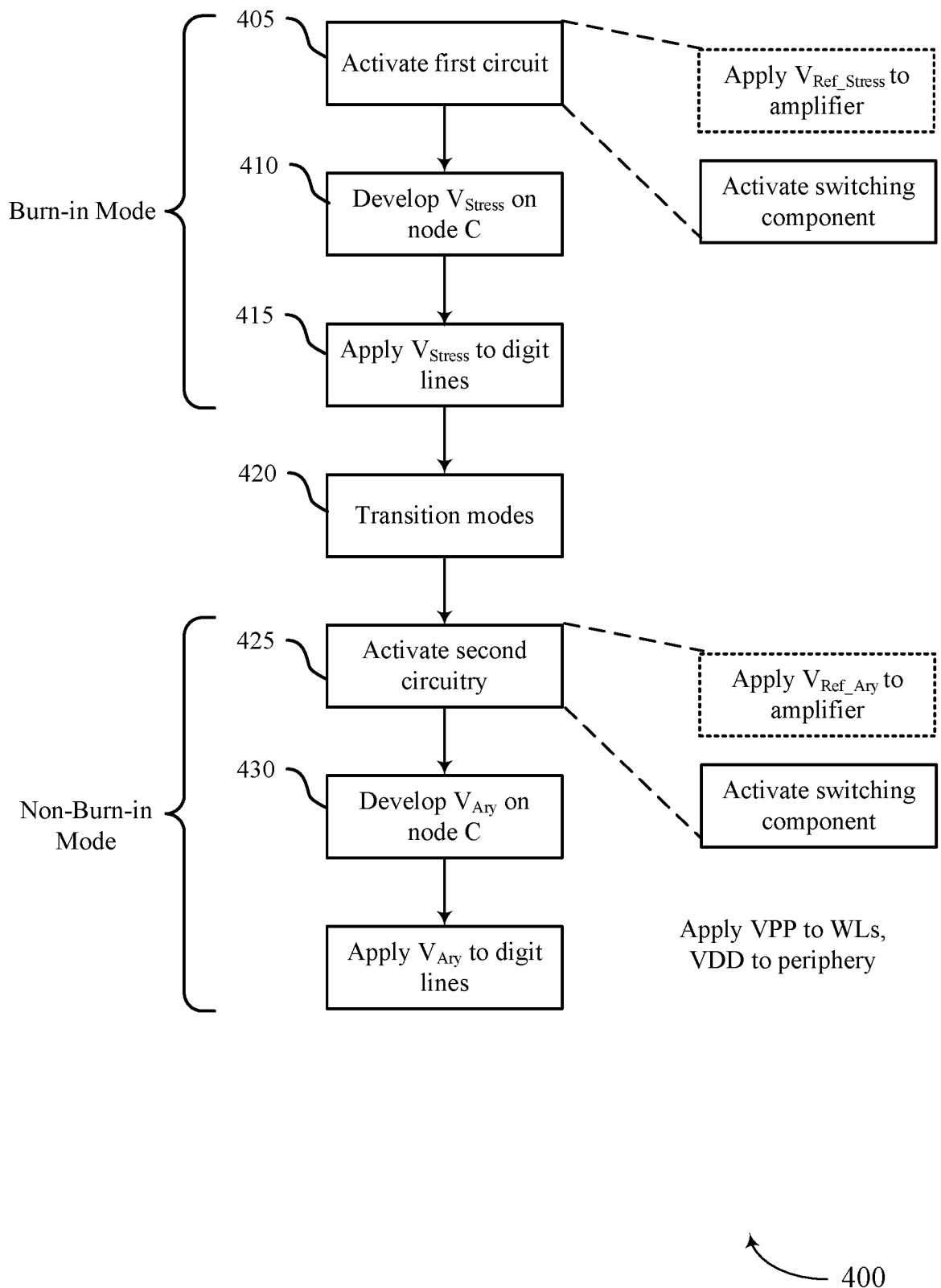
FIG. 4 illustrates an example of a process flow that supports techniques for generating access line voltages in accordance with examples as disclosed herein.

FIG. 4 illustrates an example of a process flow 400 that supports techniques for generating access line voltages in accordance with examples as disclosed herein. The process flow 400 may be implemented by a system such as the system 300 as described herein. Implementation of the process flow 400 may allow the system to use different voltage supplies to generate digit line voltage in different modes, which may improve the performance and longevity of the system.

At 405, the system 300 may activate a first circuit (e.g., circuit 335) that is coupled with a first voltage supply (e.g., voltage supply 315), circuitry (e.g., word line circuitry 330) that is configured to provide voltage for word lines in a memory array, and circuitry (e.g., digit line circuitry 340) that is configured to provide voltage to digit lines in a memory array. The system 300 may activate the circuit 335 based on determining that the system 300 is in a mode for stressing the system 300 (e.g., burn-in mode). The system 300 may activate the circuit 335 by applying a reference voltage (e.g., $V_{Ref\_Stress}$) to amplifier 365, which in turn may apply an activation voltage to the switching component 360. Alternatively, the activation voltage may be applied by a component other than the amplifier 365.

At 410, the system 300 may develop a voltage (e.g., $V_{Stress}$) on a node (e.g., node C) that is coupled (e.g., via the digit line circuitry 340) with the digit lines. The voltage $V_{Stress}$ may be developed in response to activating the circuit 335 and may be based on the voltage $V_{EXT\_H}$ supplied by the voltage supply 315. In some examples, the voltage $V_{Stress}$ may be equal to the voltage $V_{EXT\_H}$; in other examples, the voltage $V_{Stress}$ may be less than the voltage $V_{EXT\_H}$. At 415 (e.g., after the voltage $V_{Stress}$ is developed on node C), the system 300 may (e.g., via the digit line circuitry 340) apply the voltage $V_{Stress}$ to the digit lines.

So, the voltage $V_{Stress}$ may be applied to the digit lines during the burn-in mode. Also during the burn-in mode, the system 300 may (e.g., via the word line circuitry 330) apply a voltage based on $V_{EXT\_H}$ to word lines in the memory array and may apply $V_{EXT\_L}$ to the circuitry 320. The system 300 may also deactivate the circuit 325 during the burn-in mode (e.g., to decouple node C from the voltage supply 310). For example, the system 300 may apply (e.g., via the amplifier 355) a deactivation voltage to the switching component 350.

At 420, the system 300 may transition between modes. For example, the system 300 may transition from the burn-in-mode to the non-burn-in mode. The system 300 may transition to the non-burn-in mode if the system 300 is re-started or if the system 300 determines that a threshold duration has elapsed since starting the burn-in mode or since activating the circuit 335. Transitioning between modes of the system 300 may involve deactivating the circuit 335.

At 425, the system 300 may activate a second circuit (e.g., circuit 325) that is coupled with a second voltage supply (e.g., voltage supply 310) and the circuitry (e.g., digit line circuitry 340) that is configured to provide voltage to the digit lines. The system 300 may activate the circuit 325 based on determining that the system 300 is in a non-burn-in mode. The system 300 may activate the circuit 325 by applying a reference voltage (e.g., $V_{Ref\_Ary}$) to amplifier 355, which in turn may apply an activation voltage to the switching component 350. Alternatively, the activation voltage may be applied by a component other than the amplifier 355.

At 430, the system 300 may develop a voltage (e.g., $V_{Ary}$) on a node (e.g., node C) that is coupled (e.g., via the digit line circuitry 340) with the digit lines. The voltage $V_{Ary}$ may be developed in response to activating the circuit 325 and may be based on the voltage $V_{EXT\_L}$ supplied by the voltage supply 310. In some examples, the voltage $V_{Ary}$ may be equal to the voltage $V_{EXT\_L}$; in other examples, the voltage $V_{Ary}$ may be less than the voltage $V_{EXT\_L}$. At 435 (e.g., after the voltage $V_{Ary}$ is developed on node C), the system 300 may (e.g., via the digit line circuitry 340) apply the voltage $V_{Ary}$ to the digit lines.

So, the voltage $V_{Ary}$ may be applied to the digit lines during the non-burn-in mode. Also during the non-burn-in mode, the system 300 may (e.g., via the word line circuitry 330) apply a voltage based on $V_{EXT\_H}$ to word lines in the memory array and may apply $V_{EXT\_L}$ to the circuitry 320. The system 300 may also deactivate the circuit 335 during the non-burn-in mode (e.g., to decouple node C from the voltage supply 315). For example, the system 300 may apply (e.g., via the amplifier 365) a deactivation voltage to the switching component 360.

Thus, the system may use different voltage supplies to generate digit line voltage in different modes, which may improve the performance and longevity of the system.

Alternative examples of the foregoing may be implemented, where some operations are performed in a different order than described, are performed in parallel, or are not performed at all. In some cases, operations may include additional features not mentioned herein, or further operations may be added. Additionally, certain operations may be performed multiple times or certain combinations of operations may repeat or cycle. For example, as part of testing the system may cycle between the burn-in mode and the non-burn-in mode multiple times.

Figure 5:
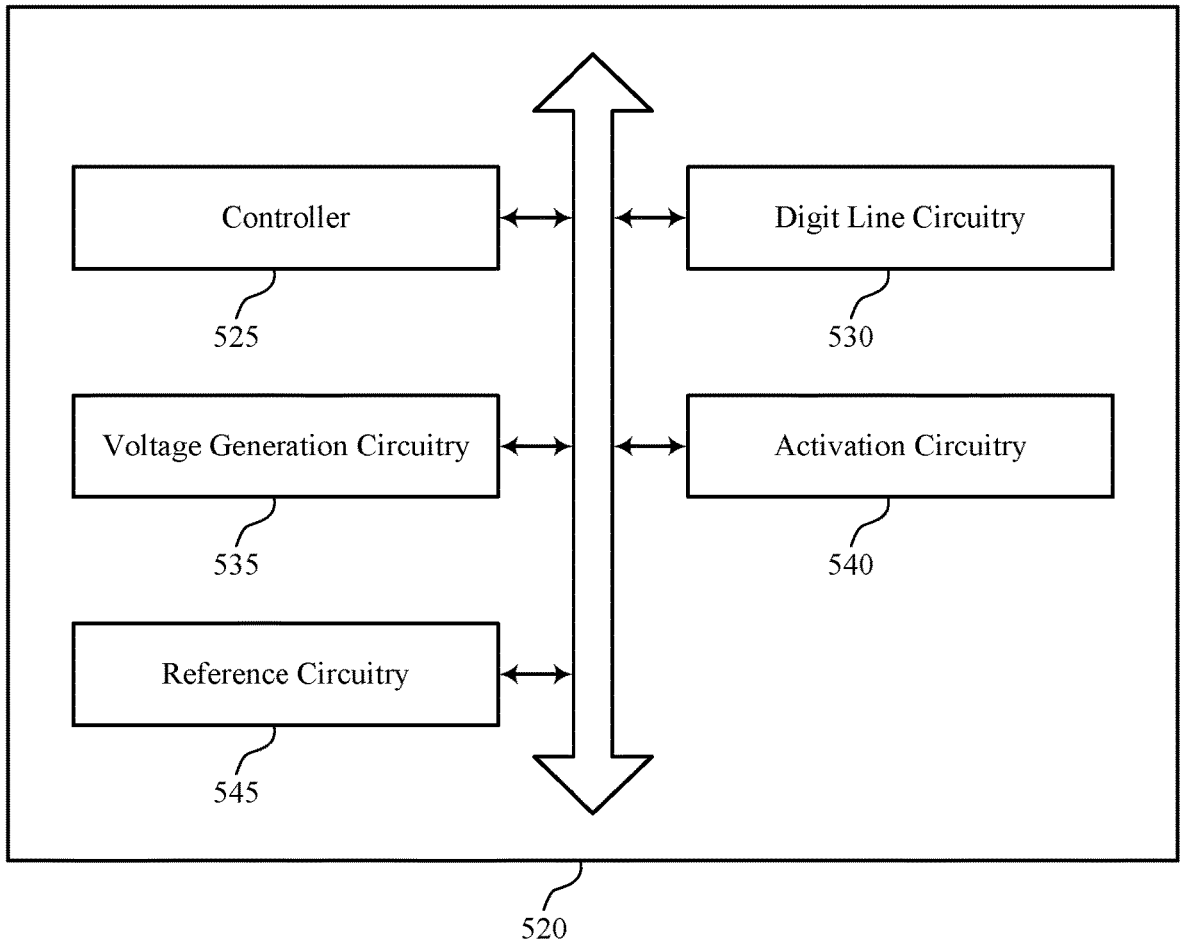
FIG. 5 shows a block diagram of a memory device that supports techniques for generating access line voltages in accordance with examples as disclosed herein.

FIG. 5 shows a block diagram 500 of a memory device 520 that supports techniques for generating access line voltages in accordance with examples as disclosed herein. The memory device 520 may be an example of aspects of a memory device as described with reference to FIGS. 1 through 4. The memory device 520, or various components thereof, may be an example of means for performing various aspects of techniques for generating access line voltages as described herein. For example, the memory device 520 may include a controller 525, a digit line circuitry 530, a voltage generation circuitry 535, an activation circuitry 540, a reference circuitry 545, or any combination thereof. Each of these components may communicate, directly or indirectly, with one another (e.g., via one or more buses).

The controller 525 may be configured as or otherwise support a means for activating a first circuit to couple a node with a first voltage supply for supplying voltage for a set of word lines in a memory array, the node coupled with a set of digit lines in the memory array. The digit line circuitry 530 may be configured as or otherwise support a means for applying a first voltage to the set of digit lines based at least in part on activating the first circuit, the first voltage based at least in part on a voltage output by the first voltage supply. In some examples, the controller 525 may be configured as or otherwise support a means for activating a second circuit to couple the node with a second voltage supply for supplying voltage to peripheral circuitry. In some examples, the digit line circuitry 530 may be configured as or otherwise support a means for applying a second voltage to the set of digit lines based at least in part on activating the first circuit, the second voltage based at least in part on a voltage output by the second voltage supply.

In some examples, the voltage output by the first voltage supply is higher than the voltage output by the second voltage supply.

In some examples, the controller 525 may be configured as or otherwise support a means for deactivating the first circuit to decouple the node from the first voltage supply, where the second circuit is activated based at least in part on deactivating the first circuit.

In some examples, the activation circuitry 540 may be configured as or otherwise support a means for applying a first activation voltage to a first switching component of the first circuit, where the first circuit is activated based at least in part on applying the first activation voltage. In some examples, the activation circuitry 540 may be configured as or otherwise support a means for applying a second activation voltage to a second switching component of the second circuit, where the second circuit is activated based at least in part on applying the second activation voltage.

In some examples, the reference circuitry 545 may be configured as or otherwise support a means for applying a first reference voltage to a first amplifier coupled with the first switching component, where the first circuit includes the first amplifier and the first activation voltage is output by the first amplifier based at least in part on applying the first reference voltage. In some examples, the reference circuitry 545 may be configured as or otherwise support a means for applying a second reference voltage to a second amplifier coupled with the second switching component, where the second circuit includes the second amplifier and the second activation voltage is output by the second amplifier based at least in part on applying the second reference voltage.

In some examples, the first voltage is higher than the second voltage, and the controller 525 may be configured as or otherwise support a means for operating the memory array in a first mode for stressing the memory array, where the first voltage is applied in the first mode. In some examples, the first voltage is higher than the second voltage, and the controller 525 may be configured as or otherwise support a means for operating the memory array in a second mode after operating the memory array in the first mode, where the second voltage is applied in the second mode.

In some examples, the controller 525 may be configured as or otherwise support a means for activating a first switching component that is coupled with a first voltage supply and a node that is coupled with a set of digit lines in a memory array. The voltage generation circuitry 535 may be configured as or otherwise support a means for developing, from the first voltage supply, a first voltage on the node coupled with the set of digit lines based at least in part on activating the first switching component. In some examples, the controller 525 may be configured as or otherwise support a means for activating a second switching component that is coupled with the node and a second voltage supply that for supplying a lower voltage than the first voltage supply. In some examples, the voltage generation circuitry 535 may be configured as or otherwise support a means for developing, from the second voltage supply coupled with the second switching component, a second voltage on the node based at least in part on activating the first switching component.

In some examples, the digit line circuitry 530 may be configured as or otherwise support a means for applying the first voltage to the set of digit lines in a first mode. In some examples, the digit line circuitry 530 may be configured as or otherwise support a means for applying the second voltage to the set of digit lines in a second mode.

In some examples, the first voltage is lower than a voltage from the first voltage supply and is higher than a voltage from the second voltage supply. In some examples, the second voltage is equal to the voltage from the second voltage supply.

In some examples, the activation circuitry 540 may be configured as or otherwise support a means for applying a first activation voltage to the first switching component, where the first switching component is activated based at least in part on applying the first activation voltage. In some examples, the activation circuitry 540 may be configured as or otherwise support a means for applying a second activation voltage to the second switching component, where the first switching component is activated based at least in part on applying the first activation voltage.

In some examples, the reference circuitry 545 may be configured as or otherwise support a means for applying a first reference voltage to a first amplifier coupled with the first switching component, where the first switching component is activated based at least in part on applying the first reference voltage. In some examples, the reference circuitry 545 may be configured as or otherwise support a means for applying a second reference voltage to a second amplifier coupled with the first switching component, where the second switching component is activated based at least in part on applying the second reference voltage.

In some examples, the controller 525 may be configured as or otherwise support a means for deactivating the first switching component before activating the second switching component.

In some examples, the controller 525 may be configured as or otherwise support a means for determining that a threshold duration has elapsed since activating the first switching component, where the first switching component is deactivated based at least in part on determining that the threshold duration has elapsed.

Figure 6:
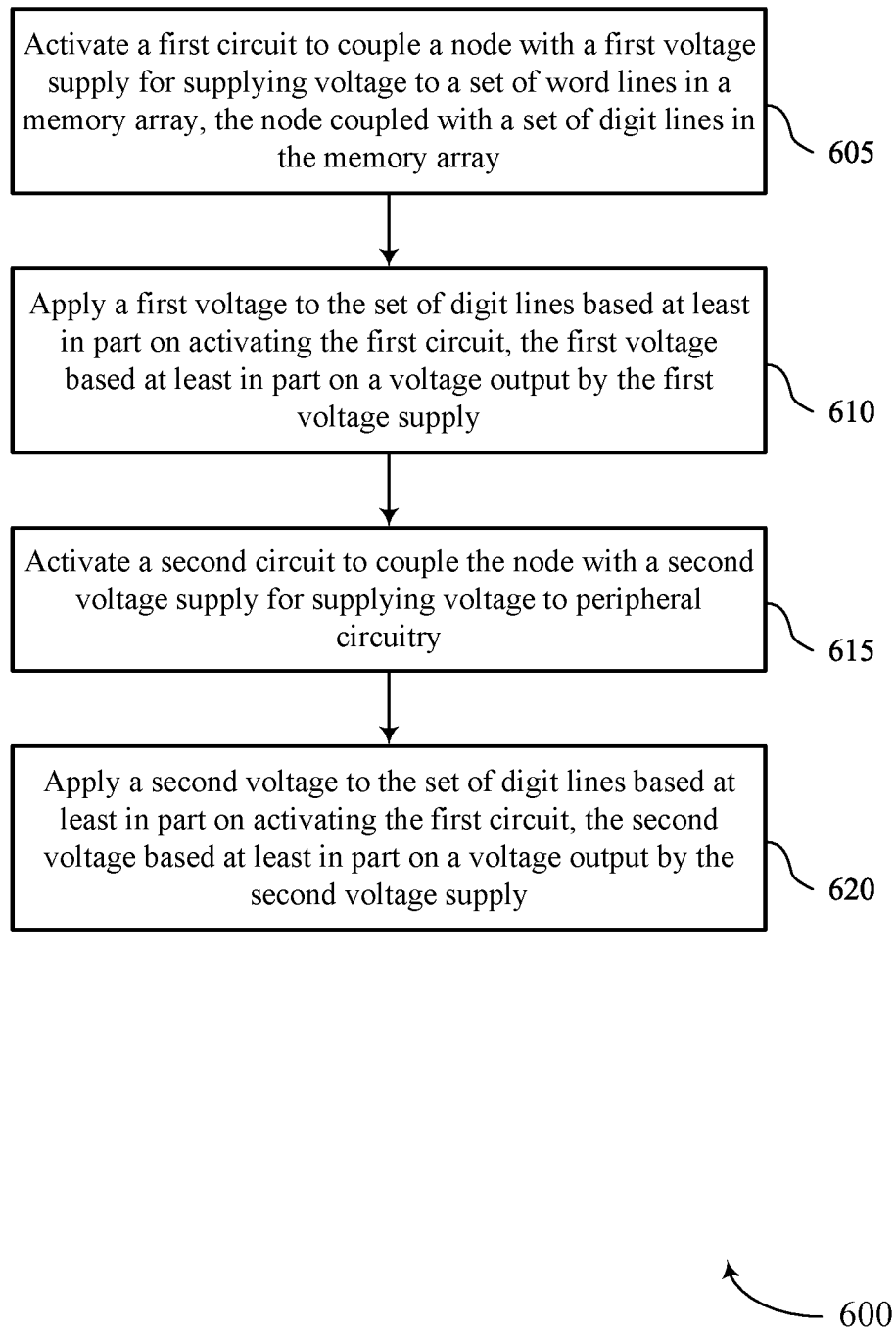
FIGS. 6 and 7 show flowcharts illustrating a method or methods that support techniques for generating access line voltages in accordance with examples as disclosed herein.

FIG. 6 shows a flowchart illustrating a method 600 that supports techniques for generating access line voltages in accordance with examples as disclosed herein. The operations of method 600 may be implemented by a memory device or its components as described herein. For example, the operations of method 600 may be performed by a memory device as described with reference to FIGS. 1 through 5. In some examples, a memory device may execute a set of instructions to control the functional elements of the device to perform the described functions. Additionally, or alternatively, the memory device may perform aspects of the described functions using special-purpose hardware.

At 605, the method may include activating a first circuit to couple a node with a first voltage supply for supplying voltage for a set of word lines in a memory array, the node coupled with a set of digit lines in the memory array. The operations of 605 may be performed in accordance with examples as disclosed herein. In some examples, aspects of the operations of 605 may be performed by a controller 525 as described with reference to FIG. 5.

At 610, the method may include applying a first voltage to the set of digit lines based at least in part on activating the first circuit, the first voltage based at least in part on a voltage output by the first voltage supply. The operations of 610 may be performed in accordance with examples as disclosed herein. In some examples, aspects of the operations of 610 may be performed by a digit line circuitry 530 as described with reference to FIG. 5.

At 615, the method may include activating a second circuit to couple the node with a second voltage supply for supplying voltage to peripheral circuitry. The operations of 615 may be performed in accordance with examples as disclosed herein. In some examples, aspects of the operations of 615 may be performed by a controller 525 as described with reference to FIG. 5.

At 620, the method may include applying a second voltage to the set of digit lines based at least in part on activating the first circuit, the second voltage based at least in part on a voltage output by the second voltage supply. The operations of 620 may be performed in accordance with examples as disclosed herein. In some examples, aspects of the operations of 620 may be performed by a digit line circuitry 530 as described with reference to FIG. 5.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for activating a first circuit to couple a node with a first voltage supply for supplying voltage for a set of word lines in a memory array, the node coupled with a set of digit lines in the memory array; applying a first voltage to the set of digit lines based at least in part on activating the first circuit, the first voltage based at least in part on a voltage output by the first voltage supply; activating a second circuit to couple the node with a second voltage supply for supplying voltage to peripheral circuitry; and applying a second voltage to the set of digit lines based at least in part on activating the first circuit, the second voltage based at least in part on a voltage output by the second voltage supply.

Aspect 2: The method, apparatus, or non-transitory computer-readable medium of aspect 1 where the voltage output by the first voltage supply is higher than the voltage output by the second voltage supply.

Aspect 3: The method, apparatus, or non-transitory computer-readable medium of any of aspects 1 through 2, further including operations, features, circuitry, logic, means, or instructions, or any combination thereof for deactivating the first circuit to decouple the node from the first voltage supply, where the second circuit is activated based at least in part on deactivating the first circuit.

Aspect 4: The method, apparatus, or non-transitory computer-readable medium of any of aspects 1 through 3, further including operations, features, circuitry, logic, means, or instructions, or any combination thereof for applying a first activation voltage to a first switching component of the first circuit, where the first circuit is activated based at least in part on applying the first activation voltage and applying a second activation voltage to a second switching component of the second circuit, where the second circuit is activated based at least in part on applying the second activation voltage.

Aspect 5: The method, apparatus, or non-transitory computer-readable medium of aspect 4, further including operations, features, circuitry, logic, means, or instructions, or any combination thereof for applying a first reference voltage to a first amplifier coupled with the first switching component, where the first circuit includes the first amplifier and the first activation voltage is output by the first amplifier based at least in part on applying the first reference voltage and applying a second reference voltage to a second amplifier coupled with the second switching component, where the second circuit includes the second amplifier and the second activation voltage is output by the second amplifier based at least in part on applying the second reference voltage.

Aspect 6: The method, apparatus, or non-transitory computer-readable medium of any of aspects 1 through 5 where the first voltage is higher than the second voltage and the method, apparatuses, and non-transitory computer-readable medium, further includes operations, features, circuitry, logic, means, or instructions, or any combination thereof for operating the memory array in a first mode for stressing the memory array, where the first voltage is applied in the first mode and operating the memory array in a second mode after operating the memory array in the first mode, where the second voltage is applied in the second mode.

Figure 7:
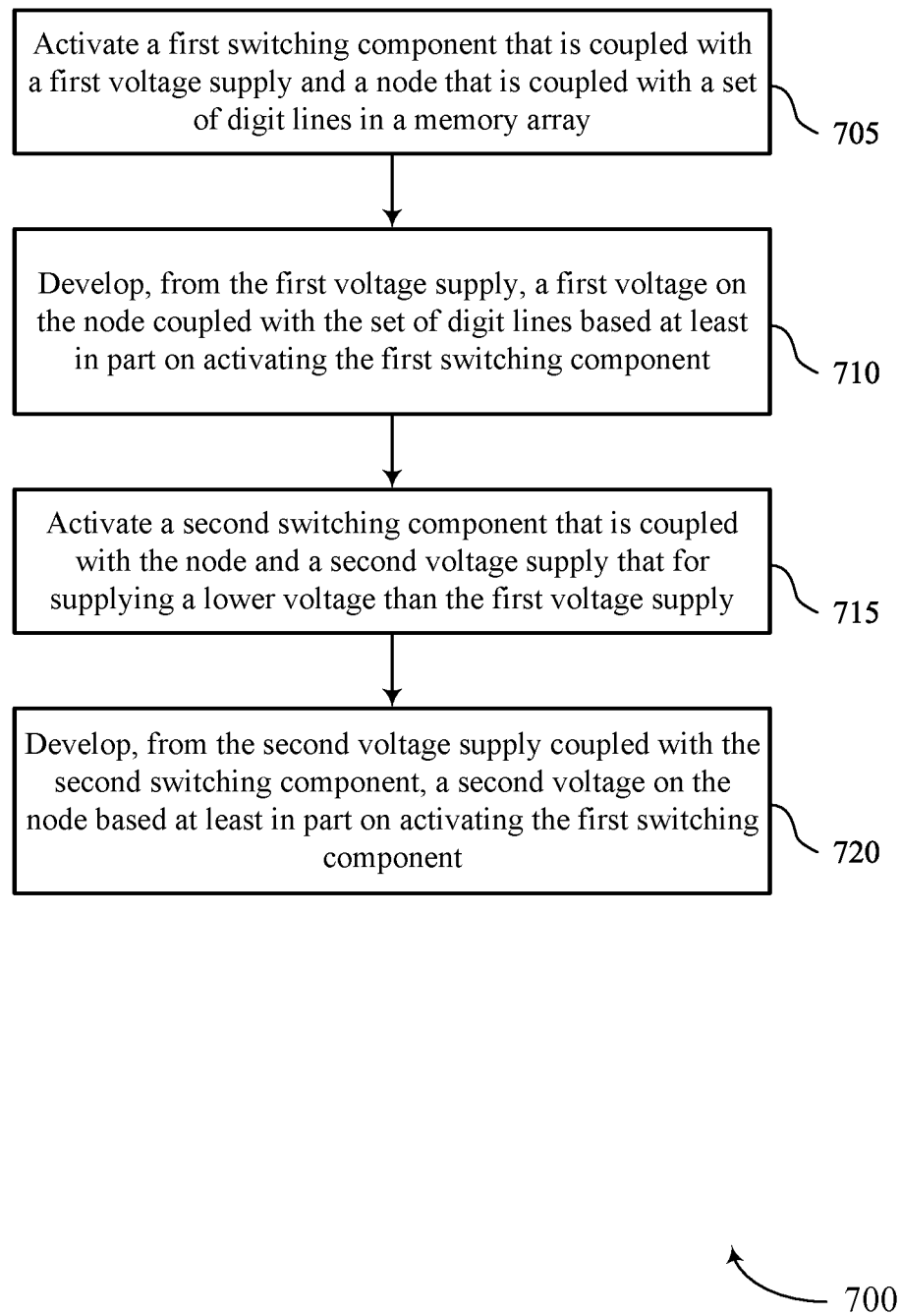

FIG. 7 shows a flowchart illustrating a method 700 that supports techniques for generating access line voltages in accordance with examples as disclosed herein. The operations of method 700 may be implemented by a memory device or its components as described herein. For example, the operations of method 700 may be performed by a memory device as described with reference to FIGS. 1 through 5. In some examples, a memory device may execute a set of instructions to control the functional elements of the device to perform the described functions. Additionally, or alternatively, the memory device may perform aspects of the described functions using special-purpose hardware.

At 705, the method may include activating a first switching component that is coupled with a first voltage supply and a node that is coupled with a set of digit lines in a memory array. The operations of 705 may be performed in accordance with examples as disclosed herein. In some examples, aspects of the operations of 705 may be performed by a controller 525 as described with reference to FIG. 5.

At 710, the method may include developing, from the first voltage supply, a first voltage on the node coupled with the set of digit lines based at least in part on activating the first switching component. The operations of 710 may be performed in accordance with examples as disclosed herein. In some examples, aspects of the operations of 710 may be performed by a voltage generation circuitry 535 as described with reference to FIG. 5.

At 715, the method may include activating a second switching component that is coupled with the node and a second voltage supply that for supplying a lower voltage than the first voltage supply. The operations of 715 may be performed in accordance with examples as disclosed herein. In some examples, aspects of the operations of 715 may be performed by a controller 525 as described with reference to FIG. 5.

At 720, the method may include developing, from the second voltage supply coupled with the second switching component, a second voltage on the node based at least in part on activating the first switching component. The operations of 720 may be performed in accordance with examples as disclosed herein. In some examples, aspects of the operations of 720 may be performed by a voltage generation circuitry 535 as described with reference to FIG. 5.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 7: A method, apparatus, or non-transitory computer-readable medium including operations, features, circuitry, logic, means, or instructions, or any combination thereof for activating a first switching component that is coupled with a first voltage supply and a node that is coupled with a set of digit lines in a memory array; developing, from the first voltage supply, a first voltage on the node coupled with the set of digit lines based at least in part on activating the first switching component; activating a second switching component that is coupled with the node and a second voltage supply that for supplying a lower voltage than the first voltage supply; and developing, from the second voltage supply coupled with the second switching component, a second voltage on the node based at least in part on activating the first switching component.

Aspect 8: The method, apparatus, or non-transitory computer-readable medium of aspect 7, further including operations, features, circuitry, logic, means, or instructions, or any combination thereof for applying the first voltage to the set of digit lines in a first mode and applying the second voltage to the set of digit lines in a second mode.

Aspect 9: The method, apparatus, or non-transitory computer-readable medium of aspect 8 where the first voltage is lower than a voltage from the first voltage supply and is higher than a voltage from the second voltage supply and the second voltage is equal to the voltage from the second voltage supply.

Aspect 10: The method, apparatus, or non-transitory computer-readable medium of any of aspects 7 through 9, further including operations, features, circuitry, logic, means, or instructions, or any combination thereof for applying a first activation voltage to the first switching component, where the first switching component is activated based at least in part on applying the first activation voltage and applying a second activation voltage to the second switching component, where the first switching component is activated based at least in part on applying the first activation voltage.

Aspect 11: The method, apparatus, or non-transitory computer-readable medium of any of aspects 7 through 10, further including operations, features, circuitry, logic, means, or instructions, or any combination thereof for applying a first reference voltage to a first amplifier coupled with the first switching component, where the first switching component is activated based at least in part on applying the first reference voltage and applying a second reference voltage to a second amplifier coupled with the first switching component, where the second switching component is activated based at least in part on applying the second reference voltage.

Aspect 12: The method, apparatus, or non-transitory computer-readable medium of any of aspects 7 through 11, further including operations, features, circuitry, logic, means, or instructions, or any combination thereof for deactivating the first switching component before activating the second switching component.

Aspect 13: The method, apparatus, or non-transitory computer-readable medium of aspect 12, further including operations, features, circuitry, logic, means, or instructions, or any combination thereof for determining that a threshold duration has elapsed since activating the first switching component, where the first switching component is deactivated based at least in part on determining that the threshold duration has elapsed.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 14: An apparatus, including: a first voltage supply configured to supply voltage for a set of word lines in a memory array of the apparatus; a first circuit coupled with the first voltage supply and configured to develop a first voltage on a node coupled with a set of digit lines in the memory array based at least in part on the first voltage supply; a second voltage supply configured to supply voltage to peripheral circuitry of the apparatus; and a second circuit coupled with the second voltage supply and configured to develop a second voltage on the node based at least in part on the second voltage supply.

Aspect 15: The apparatus of aspect 14, further including: a first switching component in the first circuit, the first switching component configured to transfer current from the first voltage supply to the node; and a second switching component in the second circuit, the second switching component configured to transfer current from the second voltage supply to the node.

Aspect 16: The apparatus of aspect 15, further including: a first amplifier in the first circuit, the first amplifier configured to control the first switching component.

Aspect 17: The apparatus of aspect 16, further including: a second amplifier in the second circuit, the second amplifier configured to control the second switching component.

Aspect 18: The apparatus of any of aspects 14 through 17, where an output node of the first circuit is coupled with an input node of the first circuit, and an output node of the second circuit is coupled with an input node of the second circuit.

Aspect 19: The apparatus of any of aspects 14 through 18, further including: a first amplifier configured to activate a first switching component based at least in part on a first reference voltage, where the first circuit includes the first amplifier and the first switching component, and where the first switching component is configured to transfer current from the first voltage supply to the node based at least in part on being activated.

Aspect 20: The apparatus of aspect 19, further including: a second amplifier configured to activate a second switching component based at least in part on a second reference voltage, where the second circuit includes the second amplifier and the second switching component, and where the second switching component is configured to transfer current from the second voltage supply to the node based at least in part on being activated.

Aspect 21: The apparatus of aspect 20, where the node is coupled with an output node of the first switching component and an output node of the second switching component, the output node of the first switching component is coupled with an input node of the first amplifier, and the output node of the second switching component is coupled with an input node of the second amplifier.

An apparatus is described. The following provides an overview of aspects of the apparatus as described herein:

Aspect 22: An apparatus, including: a first voltage supply configured to supply a higher voltage than a second voltage supply; a first switching component configured to couple the first voltage supply with a node that is coupled with a set of digit lines in a memory array of the apparatus; a first amplifier configured to control the first switching component; a second switching component configured to couple the second voltage supply with the node that is coupled with the set of digit lines; and a second amplifier configured to control the second switching component.

Aspect 23: The apparatus of aspect 22, where the first amplifier is configured to activate the first switching component based at least in part on a first reference voltage, and the second amplifier is configured to activate the second switching component based at least in part on a second reference voltage.

Aspect 24: The apparatus of aspect 23, where the first reference voltage is higher than the second reference voltage.

Aspect 25: The apparatus of any of aspects 22 through 24, further including: an input node of the first amplifier coupled with the node and an output node of the first switching component; and an input node of the second amplifier coupled with the node and an output node of the second switching component.

Aspect 26: The apparatus of any of aspects 22 through 25, further including: a first node coupled with a set of word lines in the memory array, where the first voltage supply is coupled with the first node and configured to supply voltage for the set of word lines.

Aspect 27: The apparatus of aspect 26, further including: a second node coupled with peripheral circuitry for the memory array, where the second voltage supply is coupled with the second node and configured to supply voltage to the peripheral circuitry.

An apparatus is described. The following provides an overview of aspects of the apparatus as described herein:

Aspect 28: An apparatus, including: a memory array including a set of word lines and a set of digit lines; and a controller configured to cause the apparatus to: activate a first circuit to couple a node with a first voltage supply that is configured to supply voltage for the set of word lines, the node coupled with the set of digit lines; apply a first voltage to the set of digit lines based at least in part on activating the first circuit, the first voltage based at least in part on a voltage output by the first voltage supply; activate a second circuit to couple the node with a second voltage supply that is configured to supply voltage to peripheral circuitry; and apply a second voltage to the set of digit lines based at least in part on activating the first circuit, the second voltage based at least in part on a voltage output by the second voltage supply.

Aspect 29: The apparatus of aspect 28, where the controller is configured to cause the apparatus to: apply a first activation voltage to a first switching component of the first circuit, where the first circuit is activated based at least in part on applying the first activation voltage; and apply a second activation voltage to a second switching component of the second circuit, where the second circuit is activated based at least in part on applying the second activation voltage.

Aspect 30: The apparatus of aspect 29, where the controller is configured to cause the apparatus to: apply a first reference voltage to a first amplifier coupled with the first switching component, where the first circuit includes the first amplifier and is activated based at least in part on applying the first reference voltage; and apply a second reference voltage to a second amplifier coupled with the second switching component, where the second circuit includes the second amplifier and is activated based at least in part on applying the second reference voltage.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The terms "isolated" and "decoupled" refer to a relationship between components in which signals are not presently capable of flowing between the components. Components are isolated or decoupled from each other if there is an open circuit between them. For example, two components separated by a switch that is positioned between the components are isolated from each other when the switch is open. When a controller isolates or decouples two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    activating a first circuit to couple a node with a first voltage supply for supplying voltage to a set of word lines in a memory array, the node coupled with a set of digit lines in the memory array;
    applying a first voltage to the set of digit lines based at least in part on activating the first circuit, the first voltage based at least in part on a voltage output by the first voltage supply;

activating a second circuit to couple the node with a second voltage supply for supplying voltage to peripheral circuitry; and applying a second voltage to the set of digit lines based at least in part on activating the first circuit, the second voltage based at least in part on a voltage output by the second voltage supply.

2. The method of claim 1, wherein the voltage output by the first voltage supply is higher than the voltage output by the second voltage supply.

3. The method of claim 1, further comprising:
deactivating the first circuit to decouple the node from the first voltage supply, wherein the second circuit is activated based at least in part on deactivating the first circuit.

4. The method of claim 1, further comprising:
applying a first activation voltage to a first switching component of the first circuit, wherein the first circuit is activated based at least in part on applying the first activation voltage; and applying a second activation voltage to a second switching component of the second circuit, wherein the second circuit is activated based at least in part on applying the second activation voltage.

5. The method of claim 4, further comprising:
applying a first reference voltage to a first amplifier coupled with the first switching component, wherein the first circuit comprises the first amplifier and the first activation voltage is output by the first amplifier based at least in part on applying the first reference voltage; and applying a second reference voltage to a second amplifier coupled with the second switching component, wherein the second circuit comprises the second amplifier and the second activation voltage is output by the second amplifier based at least in part on applying the second reference voltage.

6. The method of claim 1, wherein the first voltage is higher than the second voltage, the method further comprising:
operating the memory array in a first mode for stressing the memory array, wherein the first voltage is applied in the first mode; and
operating the memory array in a second mode after operating the memory array in the first mode, wherein the second voltage is applied in the second mode.

7. An apparatus, comprising:
a first voltage supply configured to supply voltage for a set of word lines in a memory array of the apparatus;
a first circuit coupled with the first voltage supply and configured to develop a first voltage on a node coupled with a set of digit lines in the memory array based at least in part on the first voltage supply;
a second voltage supply configured to supply voltage to peripheral circuitry of the apparatus; and
a second circuit coupled with the second voltage supply and configured to develop a second voltage on the node based at least in part on the second voltage supply.

8. The apparatus of claim 7, further comprising:
a first switching component in the first circuit, the first switching component configured to transfer current from the first voltage supply to the node; and
a second switching component in the second circuit, the second switching component configured to transfer current from the second voltage supply to the node.

9. The apparatus of claim 8, further comprising:
a first amplifier in the first circuit, the first amplifier configured to control the first switching component.

10. The apparatus of claim 9, further comprising:
a second amplifier in the second circuit, the second amplifier configured to control the second switching component.

11. The apparatus of claim 7, wherein
an output node of the first circuit is coupled with an input node of the first circuit, and
an output node of the second circuit is coupled with an input node of the second circuit.

12. The apparatus of claim 7, further comprising:
a first amplifier configured to activate a first switching component based at least in part on a first reference voltage, wherein the first circuit comprises the first amplifier and the first switching component, and wherein the first switching component is configured to transfer current from the first voltage supply to the node based at least in part on being activated.

13. The apparatus of claim 12, further comprising:
a second amplifier configured to activate a second switching component based at least in part on a second reference voltage, wherein the second circuit comprises the second amplifier and the second switching component, and wherein the second switching component is configured to transfer current from the second voltage supply to the node based at least in part on being activated.

14. The apparatus of claim 13, wherein the node is coupled with an output node of the first switching component and an output node of the second switching component, the output node of the first switching component is coupled with an input node of the first amplifier, and the output node of the second switching component is coupled with an input node of the second amplifier.

15. A method, comprising:
activating a first switching component that is coupled with a first voltage supply and a node that is coupled with a set of digit lines in a memory array;
developing, from the first voltage supply, a first voltage on the node coupled with the set of digit lines based at least in part on activating the first switching component;
activating a second switching component that is coupled with the node and a second voltage supply that for supplying a lower voltage than the first voltage supply; and
developing, from the second voltage supply coupled with the second switching component, a second voltage on the node based at least in part on activating the first switching component.

16. The method of claim 15, further comprising:
applying the first voltage to the set of digit lines in a first mode; and
applying the second voltage to the set of digit lines in a second mode.

17. The method of claim 16, wherein
the first voltage is lower than a voltage from the first voltage supply and is higher than a voltage from the second voltage supply, and
the second voltage is equal to the voltage from the second voltage supply.

18. The method of claim 15, further comprising:
applying a first activation voltage to the first switching component, wherein the first switching component is activated based at least in part on applying the first activation voltage; and applying a second activation voltage to the second switching component, wherein the first switching component is activated based at least in part on applying the first activation voltage.

19. The method of claim 15, further comprising:
applying a first reference voltage to a first amplifier coupled with the first switching component, wherein the first switching component is activated based at least in part on applying the first reference voltage; and
applying a second reference voltage to a second amplifier coupled with the first switching component, wherein the second switching component is activated based at least in part on applying the second reference voltage.

20. The method of claim 15, further comprising:
deactivating the first switching component before activating the second switching component.

21. The method of claim 20, further comprising:
determining that a threshold duration has elapsed since activating the first switching component, wherein the first switching component is deactivated based at least in part on determining that the threshold duration has elapsed.

22. An apparatus, comprising:
a first voltage supply configured to supply a higher voltage than a second voltage supply;
a first switching component configured to couple the first voltage supply with a node that is coupled with a set of digit lines in a memory array of the apparatus;
a first amplifier configured to control the first switching component;
a second switching component configured to couple the second voltage supply with the node that is coupled with the set of digit lines; and
a second amplifier configured to control the second switching component.

23. The apparatus of claim 22, wherein
the first amplifier is configured to activate the first switching component based at least in part on a first reference voltage, and
the second amplifier is configured to activate the second switching component based at least in part on a second reference voltage.

24. The apparatus of claim 23, wherein the first reference voltage is higher than the second reference voltage.

25. The apparatus of claim 22, further comprising:
an input node of the first amplifier coupled with the node and an output node of the first switching component; and
an input node of the second amplifier coupled with the node and an output node of the second switching component.

26. The apparatus of claim 22, further comprising:
a first node coupled with a set of word lines in the memory array, wherein the first voltage supply is coupled with the first node and configured to supply voltage for the set of word lines.

27. The apparatus of claim 26, further comprising:
a second node coupled with peripheral circuitry for the memory array, wherein the second voltage supply is coupled with the second node and configured to supply voltage to the peripheral circuitry.

28. An apparatus, comprising:
a memory array comprising a set of word lines and a set of digit lines; and
a controller configured to cause the apparatus to:
activate a first circuit to couple a node with a first voltage supply that is configured to supply voltage for the set of word lines, the node coupled with the set of digit lines;
apply a first voltage to the set of digit lines based at least in part on activating the first circuit, the first voltage based at least in part on a voltage output by the first voltage supply;
activate a second circuit to couple the node with a second voltage supply that is configured to supply voltage to peripheral circuitry; and
apply a second voltage to the set of digit lines based at least in part on activating the first circuit, the second voltage based at least in part on a voltage output by the second voltage supply.

29. The apparatus of claim 28, wherein the controller is configured to cause the apparatus to:
apply a first activation voltage to a first switching component of the first circuit, wherein the first circuit is activated based at least in part on applying the first activation voltage; and
apply a second activation voltage to a second switching component of the second circuit, wherein the second circuit is activated based at least in part on applying the second activation voltage.

30. The apparatus of claim 29, wherein the controller is configured to cause the apparatus to:
apply a first reference voltage to a first amplifier coupled with the first switching component, wherein the first circuit comprises the first amplifier and is activated based at least in part on applying the first reference voltage; and
apply a second reference voltage to a second amplifier coupled with the second switching component, wherein the second circuit comprises the second amplifier and is activated based at least in part on applying the second reference voltage.

* * * * *